United States Patent
Madan et al.

(10) Patent No.: US 7,133,304 B2
(45) Date of Patent: Nov. 7, 2006

(54) METHOD AND APPARATUS TO REDUCE STORAGE NODE DISTURBANCE IN FERROELECTRIC MEMORY

(75) Inventors: Sudhir Kumar Madan, Richardson, TX (US); Sung-Wei Lin, Plano, TX (US); Hugh P. McAdams, McKinney, TX (US); Anand Seshadri, Plano, TX (US); Jarrod Eliason, Colorado Springs, CO (US)

(73) Assignee: Texas Instruments Incorporated, Dallas, TX (US)

( * ) Notice: Subject to any disclaimer, the term of this patent is extended or adjusted under 35 U.S.C. 154(b) by 267 days.

(21) Appl. No.: 10/805,809

(22) Filed: Mar. 22, 2004

(65) Prior Publication Data

US 2005/0207201 A1    Sep. 22, 2005

(51) Int. Cl.
*G11C 11/22* (2006.01)
(52) U.S. Cl. ...................... 365/145; 365/149
(58) Field of Classification Search ............... None
See application file for complete search history.

(56) References Cited

U.S. PATENT DOCUMENTS

| | | | |
|---|---|---|---|
| 5,550,770 A * | 8/1996 | Kuroda ................. 365/145 |
| 6,046,928 A * | 4/2000 | Takata | |
| 6,208,550 B1 * | 3/2001 | Kim | |
| 6,288,931 B1 * | 9/2001 | Kye et al. .............. 365/145 |
| 6,487,103 B1 * | 11/2002 | Yamamoto et al. | |
| 6,493,251 B1 | 12/2002 | Hoya et al. | |
| 6,510,073 B1 * | 1/2003 | Lee et al. | |
| 6,566,698 B1 * | 5/2003 | Nishihara et al. ........... 257/295 |
| 6,661,697 B1 * | 12/2003 | Yamamoto et al. | |
| 6,667,896 B1 | 12/2003 | Rickes et al. | |
| 6,717,837 B1 * | 4/2004 | Hasegawa et al. .......... 365/145 |
| 6,795,351 B1 * | 9/2004 | Sakai .................. 365/189.09 |
| 6,873,536 B1 * | 3/2005 | Komatsuzaki ............. 365/145 |
| 6,950,330 B1 * | 9/2005 | Thompson et al. ......... 365/145 |
| 6,972,984 B1 * | 12/2005 | Maruyama ................. 365/145 |
| 2003/0031042 A1 * | 2/2003 | Yamamoto et al. | |
| 2003/0103372 A1 | 6/2003 | Matsushita | |
| 2003/0174532 A1 | 9/2003 | Matsushita et al. | |
| 2003/0206430 A1 | 11/2003 | Ho | |

OTHER PUBLICATIONS

U.S. Appl. No. 10/717,146, filed Nov. 18, 2003, Sudhir K. Madan.*
U.S. Appl. No. 10/748,041, filed Dec. 29, 2003, Sudhir K. Madan.*
U.S. Appl. No. 10/847,412, filed May 17, 2004, Summerfelt et al.*
U.S. Appl. No. 10/866,834, filed Jun. 14, 2004, Madan et al.*
"A Bit-Line GND Sense Technique for Low-Voltage Operation FeRAM", Shoichiro Kawashima, Toru Endo, Akira Yamamoto, Ken'ichi Nakabayashi, Mitsuharu Nakazawa, Keizo Morita and Masaki Aoki, 2001 Symposium on VLSI Circuits Digest of Technical Papers, pp. 127 & 128.*
"A Survey of Circuit Innovations In Ferroelectric Random-Access Memories", Ali Sheikholeslami and P. Glenn Gulak, Proceedings of the IEEE, vol. 88, No. 5, May 2000, pp. 667-689.*

* cited by examiner

*Primary Examiner*—Son Mai
(74) *Attorney, Agent, or Firm*—Jacqueline J. Garner; W. James Brady, III; Frederick J. Telecky, Jr.

(57) ABSTRACT

Methods and ferroelectric devices are presented, in which pulses are selectively applied to ferroelectric memory cell wordlines to discharge cell storage node disturbances while the cell plateline and the associated bitline are held at substantially the same voltage.

25 Claims, 12 Drawing Sheets

METHOD AND APPARATUS TO REDUCE STORAGE NODE DISTURBANCE IN FERROELECTRIC MEMORY

RELATED APPLICATIONS

This application is related to U.S. patent application Ser. No. 10/717,146, filed on Nov. 18, 2003, entitled BITLINE PRECHARGE TIMING SCHEME TO IMPROVE SIGNAL MARGIN, the entirety of which is hereby incorporated by reference as if fully set forth herein.

FIELD OF INVENTION

The present invention relates generally to semiconductor devices and more particularly to improved apparatus and methods for reducing storage node disturbance in ferroelectric memory devices.

BACKGROUND OF THE INVENTION

In semiconductor memory devices, data is read from or written to memory cells in the device according to decoded address information and various other control signals. Such memory devices are used for storage of data and/or program code in personal computer systems, embedded processor-based systems, video image processing circuits, communications devices, and the like. Ferroelectric memories store data in ferroelectric capacitors, and are commonly organized in single-transistor, single-capacitor (1T1C) or two-transistor, two-capacitor (2T2C) configurations. In a folded bitline 1T1C architecture, the individual ferroelectric memory cells typically include a ferroelectric (FE) capacitor adapted to store a binary data bit, together with a MOS access transistor, which operates to selectively connect the FE capacitor to one of a pair of complementary bitlines, with the other bitline being connected to a reference voltage for read operations. The individual cells are commonly organized as individual bits of a corresponding data word, where the cells of a given word are accessed concurrently by activation of platelines and wordlines by address decoding control circuitry.

Ferroelectric memory devices provide non-volatile data storage where the cell capacitors are constructed using ferroelectric dielectric material that may be polarized in one direction or another in order to store a binary value. The ferroelectric effect allows for the retention of a stable polarization in the absence of an applied electric field due to the alignment of internal dipoles within Perovskite crystals in the ferroelectric material. This alignment may be selectively achieved by application of an electric field that exceeds a coercive field of the material. Conversely, reversal of the applied field reverses the internal dipoles. The response of the polarization of a ferroelectric capacitor to the applied voltage may be plotted as a hysteresis curve.

Data in a ferroelectric data cell is read by connecting a reference voltage to a first bitline and connecting the cell capacitor between a complementary bitline and a plateline signal. This provides a differential voltage on the bitline pair, which is connected to a differential sense amp circuit. The reference voltage is typically supplied at an intermediate voltage between the voltage associated with a capacitor storing a binary "0" and that of the capacitor storing a binary "1". The polarity of the sensed differential voltage thus represents the data stored in the cell, which is buffered by the sense amp and provided to a pair of local IO lines. The transfer of data between the ferroelectric memory cell, the sense amp circuit, and the local data bitlines is controlled by various access transistors, typically MOS devices, with switching signals being provided by control circuitry including address decoders and timing circuits in the device.

Connection of the ferroelectric cell capacitor between an activated plateline and the bitline during a read operation causes an electric field to be applied to the cell capacitor. If the field is applied in a direction to switch or reverse the internal dipoles, more charge will be moved than if the dipoles are not reversed. As a result, the sense amplifier can measure the charge applied to the cell bitlines and produce either a logic "1" or "0" differential voltage at the sense amp terminals. Since reading the cell data is a destructive operation, the sensed data is then restored to the cell following each read operation by application of another pulse to the cell platelines while the sense amp is enabled. To write data to the cell, an electric field is applied to the cell capacitor by a sense amp or write buffer to polarize it to the desired state. Ferroelectric memories provide certain performance advantages over other forms of non-volatile data storage devices, such as flash and EEPROM type memories. For example, ferroelectric memories offer short programming (e.g., write access) times and low power consumption.

Ferroelectric memory devices typically include a number of individually addressable memory cells arranged in an array configuration, wherein the array is typically organized as a matrix of rows and columns. Conventionally, data is stored into a memory array as a row, and read out from the memory array as a row, where the row typically consists of 8, 16, 32, or 64 bits of binary data. During a write operation, row decoder control circuitry provides a plateline pulse signal to the first sides of the ferroelectric cells in a data row, the other sides of which are connected to the array bitlines to receive the data. In a read operation, the decoder provides plateline pulses to the first side of each ferroelectric memory cell in a data row, and sense amplifiers are connected to the other side of the cells to sense a row of stored data bits in parallel fashion. Thus, in a single read operation, an entire row of data bits (e.g., 8, 16, 32, or 64 bits) are obtained from the memory cells in the selected row.

FIGS. 1A–1C illustrate a portion (e.g., a 32 k segment) of a ferroelectric memory device 2 organized in a folded bitline architecture, including a segment in FIG. 1A with 512 rows (words) and 64 columns (bits) of data storage cells 6 indicated as $C_{ROW-COLUMN}$, where each column of cells 6 is accessed via a pair of complementary bitlines $BL_{COLUMN}$ and $BL_{COLUMN}'$. In the first row of the device 2, for example, the cells C1-1 through C1-64 form a 64 bit data word accessible via complementary bitline pairs BL1/BL1' through BL64/BL64' by activation of a wordline WL1. The cell data is sensed during data read operations using sense amp circuits 12 (S/A C1 through S/A C64) associated with columns 1 through 64, respectively. As illustrated further in FIG. 1B, an exemplary cell 6a is formed as a 1T1C cell including a single ferroelectric cell capacitor and an access transistor to connect the cell capacitor $C_{FE}1$ and a MOS access transistor 10a between one of the complementary bitlines BL1 associated with the cell column and a plateline PL1. During memory accesses, the other bitline BL1' is selectively connected to a reference voltage generator 8 or 8' via one of a pair of switches 8a, 8b (FIG. 1A), depending upon which word is being accessed.

In the device 2, cells along WL1 and WL2 (as well as those along WL5, WL6, WL9, WL10, ..., WL509, WL510) are coupled with bitlines BL1–BL64, whereas cells along WL3 and WL4 (as well as those along WL7, WL8, WL11, WL12, ..., WL511, WL512) are coupled with bitlines BL1'–BL64'. In reading the first data word along the wordline WL1, the cells C1-1 through C1-64 are connected to the sense amps via the bitlines BL1, BL2 . . . , BL63, and BL64 while the complementary reference bitlines BL1', BL2' . . . , BL63', and BL64' are connected to the reference voltage generators 8, 8'. FIG. 1C provides a timing diagram 20 showing waveforms or signals on various nodes during a read and restore operation in the device 2 to access cells along WL1.

During a read operation, a signal level $V_1$ or $V_0$ is obtained on the array bitline BL1, depending upon the state of the data being read from the cell 6a (e.g., binary "1" or "0", respectively). A reference voltage $V_{REF}$ from the shared reference generators 8, 8' is ideally between $V_1$ and $V_0$, which is then applied to the complementary bitline BL1' (e.g., the other input of the sense amp 12). To read the data stored in the cell, the transistor 10a is turned on by applying a voltage Vwl which is typically greater or equal to Vdd plus the threshold voltage of the transistor 10a via the wordline WL1 to couple the bitline BL1 to the capacitor $C_{FE}1$. The plateline PL1 is then pulsed high, as illustrated in FIG. 1C, to cause charge sharing between the ferroelectric capacitor $C_{FE}1$ and the capacitance of the bitline BL1, by which the bitline voltage BL1 rises, depending upon the state of the cell data being read. The plateline PL1 is then returned to 0V and the sense amp 12 is activated via an enable signal SE. One input terminal of the sense amp 12 is coupled to the cell bitline (e.g., data bitline BL1) and the other differential sense amp input is coupled to a reference voltage (e.g., reference bitline BL1' in this example). In the example of FIGS. 1A–1C, the sense amp 12 is enabled after the plateline signal PL1 is again brought low, a technique referred to as "pulse sensing". Alternatively, "step sensing" can be used in the device 2, in which the sense amp is enabled via the SE signal while the plateline pulse PL1 is still high. Following a cell data read, the data is restored to the cell 6a by again pulsing the plateline high and then low while the wordline WL1 is asserted to reprogram the cell capacitor $C_{FE}1$.

Recently, ferroelectric memory devices have been proposed, in which several adjacent cell platelines are connected to a single common plateline driver in a segment, in order to conserve driver area in the device. These groups of cells form a plate group, for example, where a memory array segment of 512 rows (e.g., 512 wordlines) may have cells along wordlines WL1 through WL64 driven by a single plateline driver, with other portions of the segment forming separate plate groups of 64 rows each. Also, wordline driver circuit area may be conserved by providing common wordline drivers shared among several or all segments in a section within a memory device. For example, a 6M FeRAM may consists of 12 sections (1 through 12) and each section may have 16 segments (1 through 16) of 32K memory arrays. In a shared plateline driver configuration, accessing a selected target row in an array segment may cause unwanted charging or discharging of storage nodes associated with unselected cells within the plate group, typically by current leakage of the unselected cell transistor. Other sources of unwanted storage node charging or discharging occur in non-shared plateline configurations as well. Such unintended charge transfer can degrade signal margins required to accurately and repeatably sense the data stored in ferroelectric memory cells.

In reference to FIG. 1B, the storage node of the cell 6a is the connection between the cell capacitor $C_{FE}1$ and the cell transistor 10a. Where the selected cell 6a is read (e.g., along with other cells 6 along WL1), pulsing the plateline PL1 high causes a voltage to develop on the bitline BL1 because the cell capacitor $C_{FE}1$ discharges through the pass gate transistor 10a to the bitline BL1. Once the bitline signal is amplified by the sense amp 12 during a write or restore operation, the bitline goes high to Vdd or low to Vss, depending on whether the data being written is a binary "1" or a "0", respectively. Where the cell 6a is not selected for a read or write access (e.g., WL1 is low and transistor 10a is theoretically off), a pulse to the plateline PL1 in a shared plate line device causes the voltage at the storage node to increase, typically to a voltage near the plateline pulse voltage which is typically Vdd or higher. If the cell transistor 10a leaks (e.g., sub-threshold conduction or other transistor leakage mechanism) and the bitline BL1 is at a lower voltage than the plateline (e.g., where a data "0" is being read or written to another cell along BL1), the storage node can loose charge to the bitline BL1. The non-accessed cell 6a can also acquire charge while the plateline PL1 is low, for example, where the data on the bitline BL1 is a "1" (e.g., BL1 is at a high voltage such as Vdd), due to leakage through the cell transistor 10a.

These charge loss and gain disturbances can accumulate over a number of cycles, thereby decreasing the signal margin of the system, and possibly depolarizing the cell capacitor $C_{FE}1$ from its intended (e.g., programmed) state. Furthermore, such storage node disturbances may be worsened through wordline coupling that temporarily raises the wordline voltage WL1 while a different row is being accessed. Consequently, there is a need for improved ferroelectric memory devices and techniques by which cell storage node disturbances can be mitigated or avoided.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention provides methods and ferroelectric devices, wherein cell wordlines are selectively pulsed to discharge cell storage nodes while the cell plateline and the associated bitline are held at substantially the same voltage, by which ferroelectric memory data integrity and corresponding signal margins can be improved or maintained. The invention may be implemented in any array architectures, including open and folded bitline configurations, and may be employed in devices having any cell type, such as 1T1C, 2T2C, etc.

One aspect of the invention provides a method for accessing ferroelectric memory cells, comprising performing a read, restore, or write operation to access one or more ferroelectric memory cells along a selected wordline in a ferroelectric memory array. The methods of the invention may be employed in association with ferroelectric memory arrays in which cells along two or more wordlines are coupled with a common plateline signal during memory access operations (e.g., plate groups), as well as with arrays in which the plateline signals are provided only to cells along the selected wordline (platelines are not grouped). In one implementation, the method further comprises activating a first group consisting of one or more non-selected wordlines in the array before, during, or after the read, restore, or write operation while one or more bitlines and platelines associated with the cells along the first group wordlines are substantially at a first voltage, such as ground (Vss) or some other voltage level. The activation of the non-selected wordline or wordlines can be by a wordline pulse to momentarily turn the corresponding cell transistors partially or fully on, thus providing a discharge path from the corresponding storage node to the corresponding bitline.

In grouped plateline architectures, the wordline activation can be carried out selectively for one, some, or all wordlines in an array or a portion thereof, including cells along the selected wordline, cells in a plate group that includes the selected wordline, and/or cells in one or more non-selected plate groups (e.g., cell groups not sharing a common plateline grouping with the selected row). In addition, wordlines of other (e.g., non-accessed) segments may be likewise activated, for example, where wordline drivers and wordline activation circuits are shared among several memory segments in a section. The wordline activation for cells in the selected (e.g., first) plate group may be done each time memory cells thereof are accessed, or periodically every $N^{th}$ time memory cells in a first plate group are accessed, irrespective of the accessed segment in a section, whether or not the plate drivers for each group are shared across multiple array segments, where N is an integer greater than 1. In one implementation, the cell plate groups are partitioned into two subsets or wordline groupings, where wordlines of each subset are alternatively pulsed for every other access to the plate group, so as to conserve and/or to reduce peak power in the device. The selection of the subset for such wordline activation can be made according to programmable circuitry, shift registers, counters, or other logic circuits provided in the device, for example, such as a plate group access counter associated with the first plate group.

For non-accessed plate groups (e.g., groups not including the selected wordline for a particular access), the wordlines thereof may be activated while bitlines and platelines associated therewith are substantially at the same voltage, so as to fully or partially discharge storage nodes of cells of the non-accessed plate group. In one implementation, one non-accessed plate group is chosen for wordline activation according to a non-accessed plate group counter or shift register, that can be incremented, for example, for each device access in a section, thereby ensuring that each cell in an array segment is discharged often enough to mitigate signal margin deterioration by the time the cell is read. The non-accessed plate group wordlines can also be further partitioned into two or more subsets and only one subset of wordlines may be activated to conserve and or reduce peak power. The wordline activation of non-accessed plate groups or sub groups may be may be completely skipped during an access cycle to further reduce the power.

The above described counters and/or shift registers are provided at a section level in the exemplary implementation set forth below, since the wordlines drivers are at the section level, wherein each individual wordline runs through all segments in a section. For example, an $M^{th}$ accessed plate group counter is updated if the wordline for the accessed cells belongs to the $M^{th}$ plate group, irrespective of the accessed segment number. Similarly, the non-accessed plate group counter or shift register in a section is updated (e.g., shifted or incremented) irrespective of which segment is being accessed in the illustrated implementations. The wordlines or certain groups of wordlines can also be selectively activated prior to power-down or at power-up, in order to remove any unwanted storage node charge, even where the counter information or shift register contents have been cleared. Any suitable timing circuitry can be employed for generating wordline activation pulses for one, some or all wordlines in the device 102 after power is applied thereto, for example, including providing such pulses prior to or after loading counter or shift register values in the circuit 101a. In addition, upon removal of power from the device 102, a controlled power-down sequence may be implemented in which wordline activation pulses 113 may be provided to all or some wordlines while the corresponding bitlines and platelines are held at a first voltage, depending on the need to discharge cell storage nodes in the device 102.

In another aspect of the invention, ferroelectric memory devices are provided, comprising a memory array, a control system providing the normal wordline and plateline signals to the array during read, restore, and write operations, and a wordline pulse system coupled with the control system and with the array. The wordline pulse system activates one or more non-selected wordlines in the array before, during, or after a read, restore, or write operation while one or more bitlines and platelines associated with ferroelectric memory cells along the non-selected wordlines are both substantially at a first voltage to at least partially discharge storage nodes of cells along the one or more wordlines. This aspect of the invention contemplates devices having arrays in which common plateline signals are provided to cells along multiple wordlines (e.g., plate groupings), as well as devices in which the plateline signals are provided only to cells along the selected wordline (platelines are not grouped).

The pulse system may comprise a plurality of plate group access counters that are individually associated with plate groups of the array to indicate a number of accesses of cells in the associated plate group. In one implementation, the pulse system selectively activates a first subset of wordlines in a first plate group that includes the selected wordline before, during, or after the read, restore, or write operation while the bitlines and platelines associated with the first plate group are substantially at the first voltage according to a plate group access counter associated with the first plate group. The wordline pulse system may also comprise a non-accessed plate group counter or shift register indicating a particular plate group of the array, which determines which non-selected plate group will undergo selective wordline activation.

The following description and annexed drawings set forth in detail certain illustrative aspects and implementations of the invention. These are indicative of only a few of the various ways in which the principles of the invention may be employed.

BRIEF DESCRIPTION OF THE DRAWINGS

FIGS. 3A–3I are schematic diagrams illustrating an exemplary ferroelectric memory device having wordline pulse circuitry in accordance with another aspect of the invention.

DETAILED DESCRIPTION OF THE INVENTION

Figure 1A:
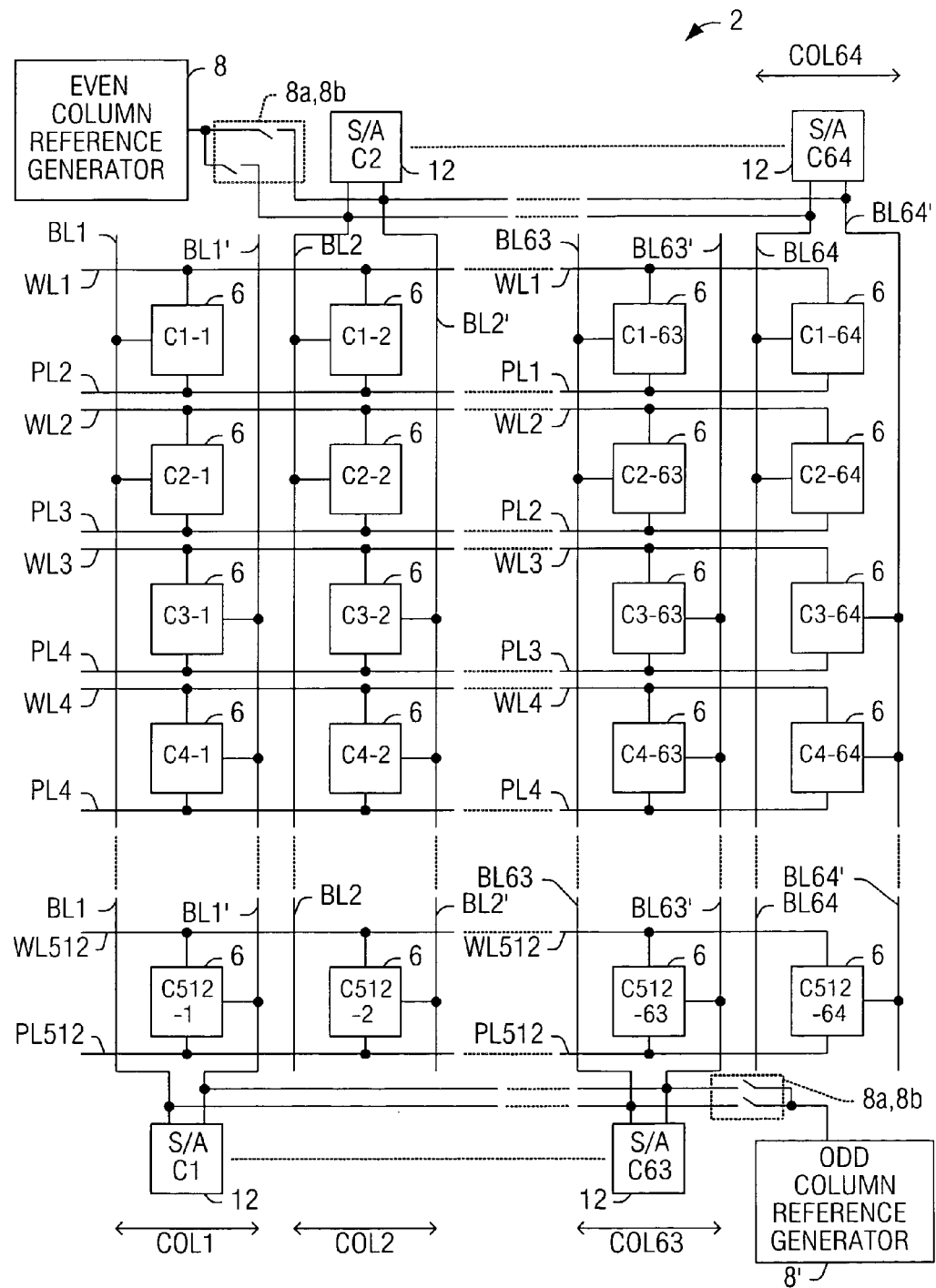
FIG. 1A is a schematic diagram illustrating a portion of a conventional 1T1C folded bitline ferroelectric memory device.

One or more implementations of the present invention will now be described with reference to the attached drawings, wherein like reference numerals are used to refer to like elements throughout. The invention relates to ferroelectric memory devices and access methods therefor, in which pulses are selectively applied to wordlines for dissipating storage node disturbance charges while the cell plateline and the associated bitline are held at substantially the same voltage. The invention is hereinafter illustrated and described in the context of folded bitline type ferroelectric memory architectures using single transistor-single capacitor (e.g., 1T1C) cells. However, the invention is not limited to the illustrated implementations, and may alternatively be employed with other cell types (e.g., 2T2C) and/or in other array architectures.

Figure 2:
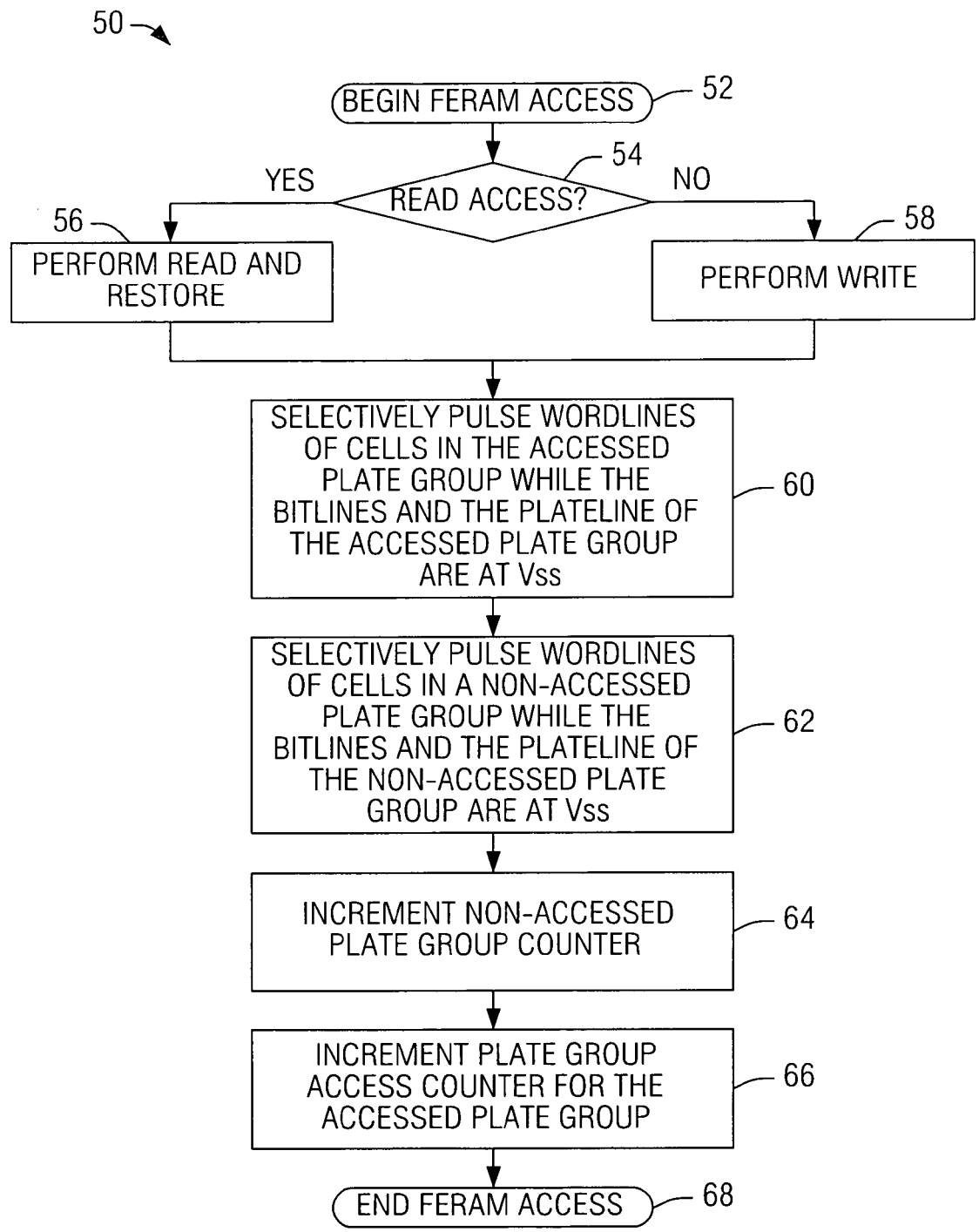
FIG. 2 is a flow diagram illustrating an exemplary method of accessing a ferroelectric memory cell in accordance with an aspect of the present invention.

Referring initially to FIG. 2, an exemplary method 50 is illustrated for accessing memory cells in a ferroelectric memory device having plate groups in which several rows of cells share a common plateline driver in accordance with an aspect of the present invention. Although the method 50 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and systems illustrated and described herein as well as in association with other structures not illustrated. For instance, the methods of the invention may also be carried out in ferroelectric memory devices that do not employ shared plateline drivers. Moreover, the various methods of the invention may also be employed in association with ferroelectric memory devices in which platelines are not grouped.

Beginning at 52, a determination is made at 54 as to whether the desired memory access operation involves reading/restoring data or writing data to a selected target row of cells. If a read/restore is needed (YES at 54), the read and restore accesses are performed at 56, otherwise (NO at 54) a write operation is performed at 58. Any suitable read, restore, or write operations may be performed at 56 or 58 within the scope of the present invention. At 60, one or more non-selected wordlines of cells of the accessed (e.g., selected) plate group are pulsed or otherwise activated while the corresponding bitlines and platelines thereof are at Vss (e.g., ground) or other first voltage level. The selected wordline may, but need not, be similarly activated at 60 within the scope of the invention. At 62, wordlines of cells of one or more non-accessed plate groups are pulsed or otherwise activated while the corresponding bitlines and platelines thereof are at Vss (e.g., ground) or other first voltage level. A non-accessed plate group counter or shift register is incremented or shifted at 64 and a plate group access counter is incremented for the accessed plate group at 66 before the ferroelectric memory access is completed at 68.

The inventors have appreciated that storage node disturbance in the form of acquired or lost charge can be accumulated over a number of access cycles to a ferroelectric memory array or segments or other portions thereof, leading to degradation in signal margin and possibly to depolarization of ferroelectric cell capacitors. The inventors have further appreciated that such undesired charge loss and/or accumulation can occur in devices in which platelines are grouped, as well as in devices that do not employ plateline groupings. In order to combat these adverse storage node disturbance effects, the above method 50 and other methods of the invention provide for activation of one or more non-selected wordlines in the array while one or more bitlines and platelines associated with the cells along these wordlines are substantially at the same voltage level, ground in the illustrated examples. This provides for full or partial discharging of any disturbance charge that may have been acquired or lost at the storage node between the cell capacitor and the cell transistor.

In the illustrated implementation, the non-selected wordlines are activated by applying a positive voltage pulse to the gates of the cell transistors to discharge storage nodes of the cells to the corresponding bitlines. The pulse can be of any amplitude, for example, at or above the threshold voltage of the cell transistors, or even less, and the pulse may be of any duration, for example, about 1 ns in the illustrated examples. The selective wordline activation at 60 and/or 62 may be at any time, such as before, during, or after a memory access operation (e.g., including read, restore, write, or other operations in which memory cells are accessed). In the illustrated implementation, the selective wordline pulse is applied after the restore operation that follows a memory read, and after a write operation. Alternatively, the selective wordline activation may be performed prior to or during such memory access operations while the bitlines are precharged to Vss or other first voltage level and while the corresponding plateline signals are held at the first voltage. In this regard, the ordering of the various acts or events in the illustrated method 50 of FIG. 2 is exemplary only, and these may be performed in any order within the scope of the invention.

In another alternative, the selective wordline activation may be performed during the memory access operations while the bitlines are precharged to Vss or other first voltage level and while the corresponding plateline signals are held at the first voltage. However, implementing such a scheme may require extra control circuitry to suspend read, restore or write operations while the selective wordline activation is being performed. The selective wordline activation can also be performed simultaneously during a read, restore or write cycle on cells for unselected portions of a memory such as one or more non-accessed segments, sections, or a non-accessed block, which will not interfere with the read, restore, or write operation of the accessed cells.

In another aspect of the invention, the selective wordline activation may, but need not, be performed every time an array segment is accessed. Furthermore, all of the array wordlines may be so activated or only certain wordlines or groups thereof may be selectively activated. In the illustrated implementations, the wordline selected for the current access operation (referred to herein as the selected wordline) may be pulsed along with non-selected wordlines in a first plate group that includes cells along the selected wordline (referred to herein as the selected plate group). In another possible implementation, the plate groups are further divided or partitioned into a number of subgroups or wordline groups (e.g., 2 subgroups in the example below), wherein the wordlines of the subgroups are alternatively activated for discharge purposes every other time the first plate group is accessed. In other possible implementations, one or more wordlines are selectively pulsed, even where plate groupings are not employed in the memory device.

This selectivity in the discharge activation of only certain wordlines may facilitate conservation of power, for example, in situations where pulsing all the wordlines in an array may be prohibitive with respect to power consumption.

Another aspect of the selective discharge techniques of the invention also provides for selectively activating wordlines of one or more non-accessed (e.g., non-selected) plate groups at 62, which may be employed alone or in combination with the selected plate group wordline activation at 60. In the examples illustrated herein, wordlines of a second plate group are also selectively activated, where the second plate group does not include cells along the selected wordline (referred to herein as a non-selected plate group). As discussed above, in a shared plateline array architecture, the non-accessed plate groups may not suffer from as much charge loss/gain as those of a selected plate group, since no plateline pulse is applied to the cells thereof. However, even these cells may loose or acquire unwanted charge, for example, where bitlines in the array are momentarily at a non-zero voltage and leakage of the non-accessed cell transistors allows charge to migrate to the storage nodes, particularly in the presence of noise being coupled onto the wordlines thereof. In the examples illustrated and described herein, the second plate group is selected from a plurality of non-accessed plate groups in a rotating fashion, for example, using a counter or a shift register with a programmable initial seed value, such that each such plate group is selectively discharged relatively often at 62. The wordlines or certain groups of wordlines can also be selectively activated prior to power-down or at power-up while the corresponding platelines and bitlines are held substantially at a first voltage, in order to remove any unwanted storage node charge, even where the counter information or shift register contents have been cleared.

Referring also to FIGS. 3A–3J, an exemplary ferroelectric memory device 102 is hereinafter illustrated and described. The exemplary device 102 comprises an array 104 of ferroelectric memory cells 106 arranged in rows and columns, along with a control system or circuit 122 coupled with the array 104 to generate wordline and plateline signals according to decoded address information or signals for read, restore, and write operations. In accordance with the invention, moreover, the device 102 also comprises a wordline pulse system or circuit 101 that selectively provides a pulse to one or more non-selected wordlines in the array before, during, or after a read, restore, or write operation while the corresponding bitlines and platelines are substantially at a first voltage.

Figure 3A:
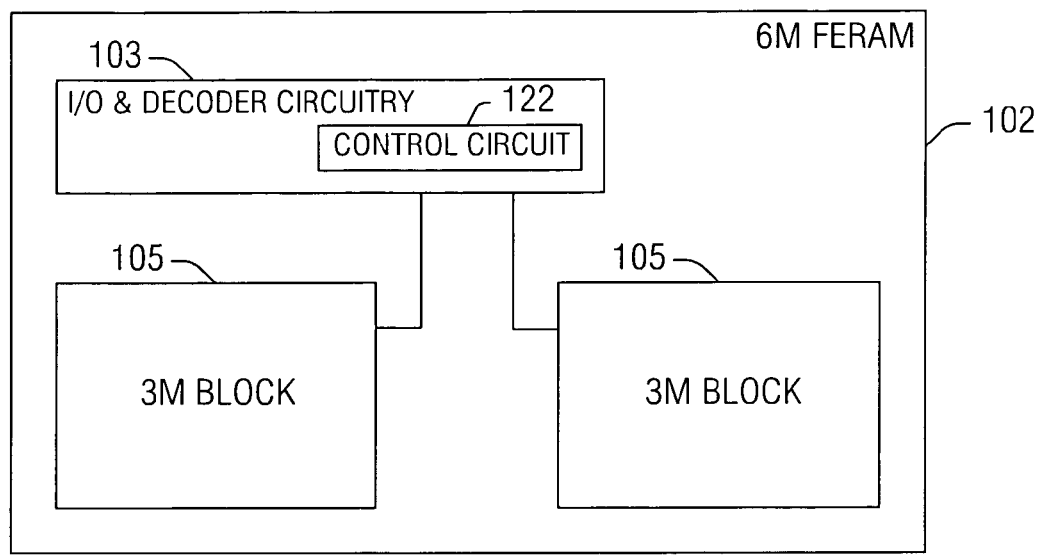
Figure 3B:
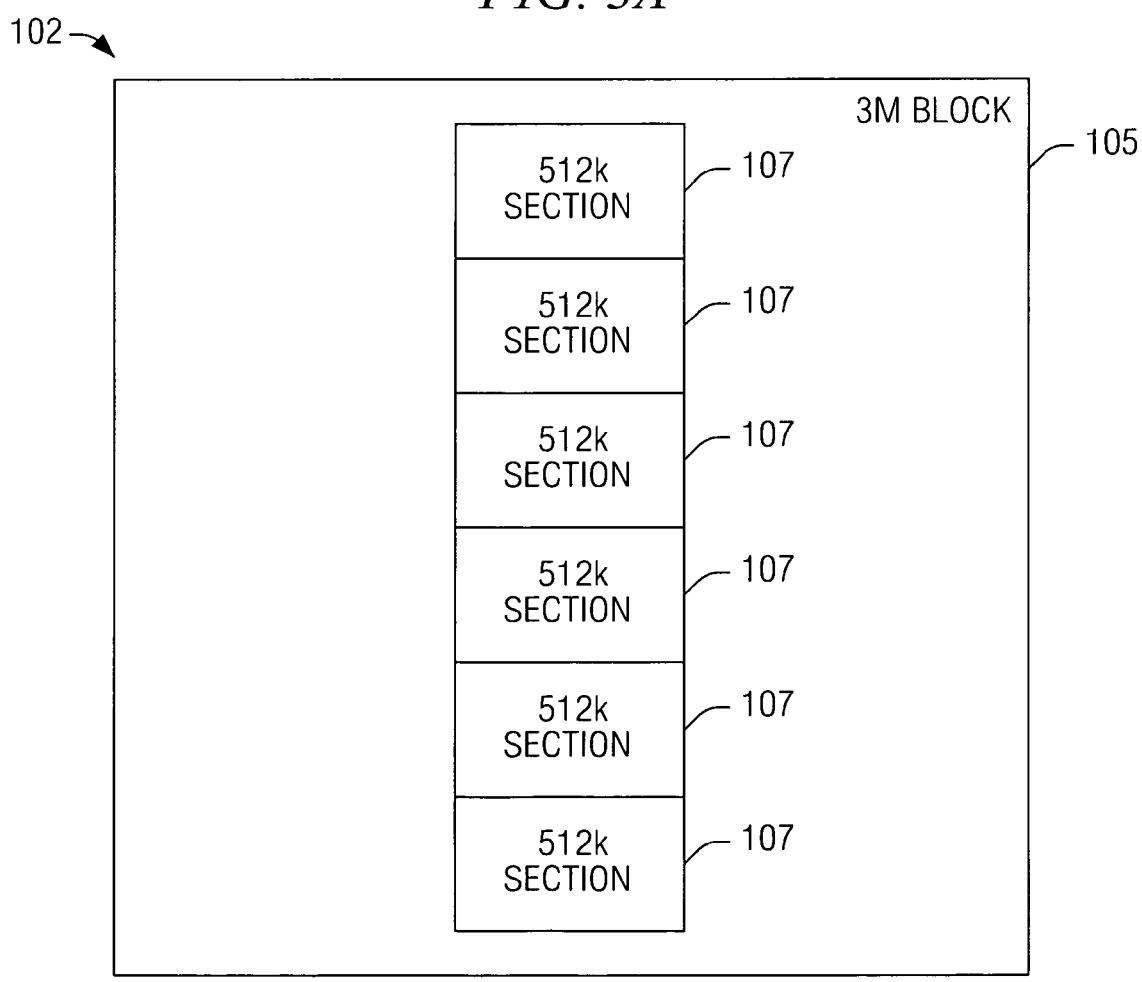
Figure 3C:
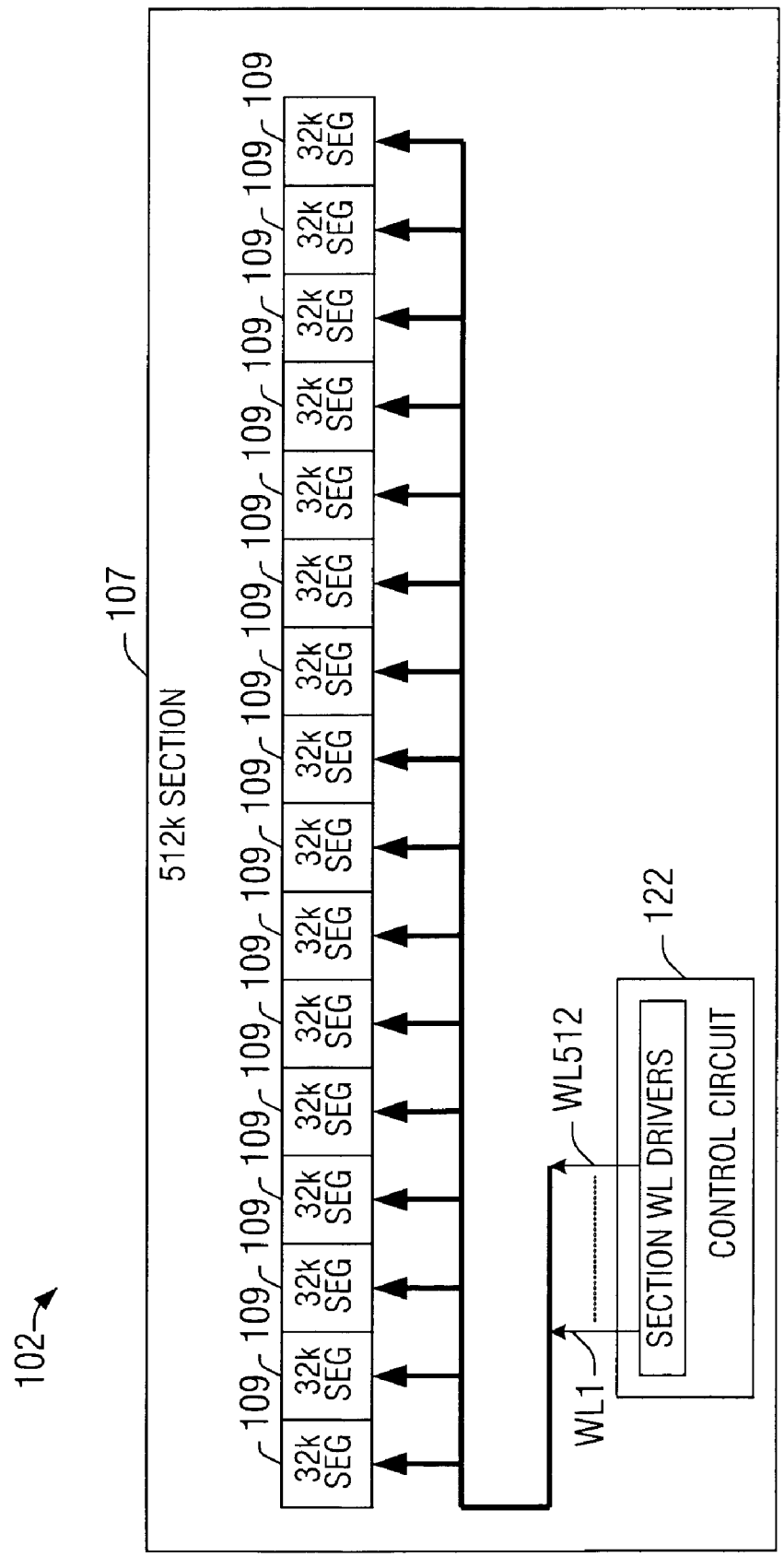
Figure 3D:
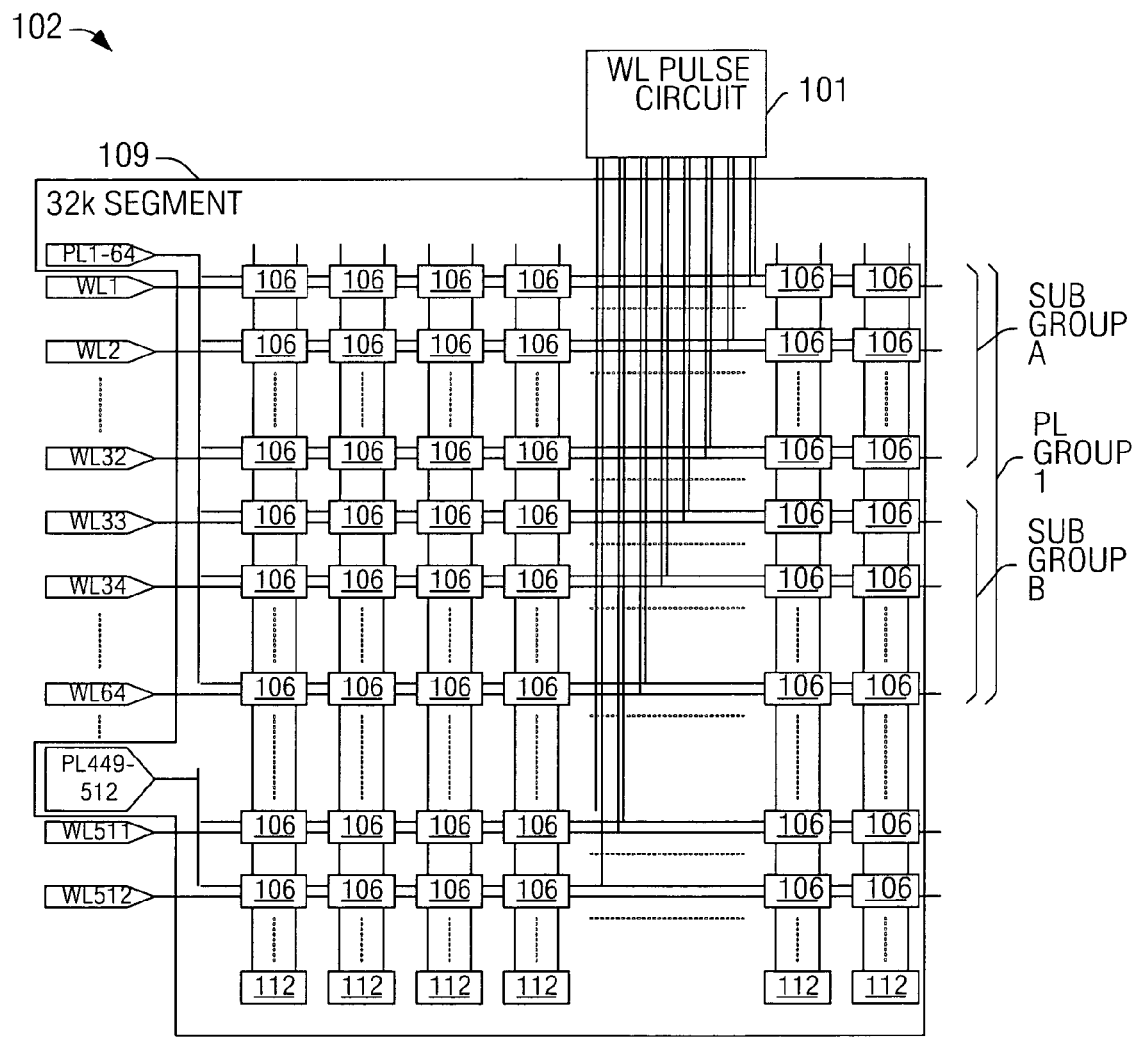

As shown in FIG. 3A, the exemplary device 102 is a 6M ferroelectric memory, including I/O and decoder circuitry 103 that comprises the control circuit 122, as well as two 3M memory blocks 105. The blocks 105 are further divided into 6 sections of 512 k each, as shown in FIGS. 3B and 3C. Each section 107 includes 16 segments 109 of 32 k each, wherein one such segment 109 is also further illustrated in FIG. 3D. Each segment includes a wordline pulse circuit or system 101 in accordance with the invention, to provide for selective wordline activation, that may, but need not, be operated generally according to the method 50 described above. As shown in FIGS. 3D and 3F, moreover, the memory cells 106 of the exemplary segments 109 are partitioned into plate groups 111 of 64 rows per plate group and the plate groups 111 are further subdivided into subgroups A and B of 32 rows each. For example, cells along wordlines WL1 through WL32 form a first subgroup A and cells along WL33–WL64 form another subgroup B of a first plate group 111 PL GROUP 1, with the other cells of the illustrated segment 109 being grouped in similar fashion. While the illustrated device 102 employs plateline grouping, the invention may be employed in devices in which platelines are not grouped, wherein all such alternative implementations are contemplated as falling within the scope of the present invention and the appended claims.

In the exemplary device 102, the wordlines and groupings thereof (e.g., plate groups and plate subgroups) extend across (e.g., are shared among) multiple segments 109 within a given section 107, wherein the wordline drivers for the individual sections 107 are considered part of the control circuit 122. The exemplary device 102, moreover, provides individual plateline driver circuits within the control circuitry 122 that are dedicated to corresponding memory segments 109. In this configuration, the selective activation of one or more wordlines simultaneously activates the gates of access transistors of cells along the activated wordlines in multiple segments 109 within a given section 107. Accordingly, a single wordline pulse circuit 101 is provided for each section 107 in the exemplary device, which is essentially shared among all the segments 109 in the section 107, although this is not a strict requirement of the invention. In this regard, the exemplary device 102 includes a non-accessed plate group counter or shift register 101d and a set of plate group access counters 101c for each section 107 that is likewise shared among the segments 109 thereof. In this implementation, the individual counters or registers are incremented or shifted regardless of which segment 109 was accessed within a section 107. However, other implementations are possible within the scope of the invention, for example, where such counters or registers 101c, 101d are grouped with individual segments 109, and are incremented only according to accesses to the corresponding segment 109. This may facilitate lower activation frequencies for a given wordline pulse circuit 101, wherein all such alternate implementations are contemplated as falling within the scope of the present invention and the appended claims.

Figure 3E:
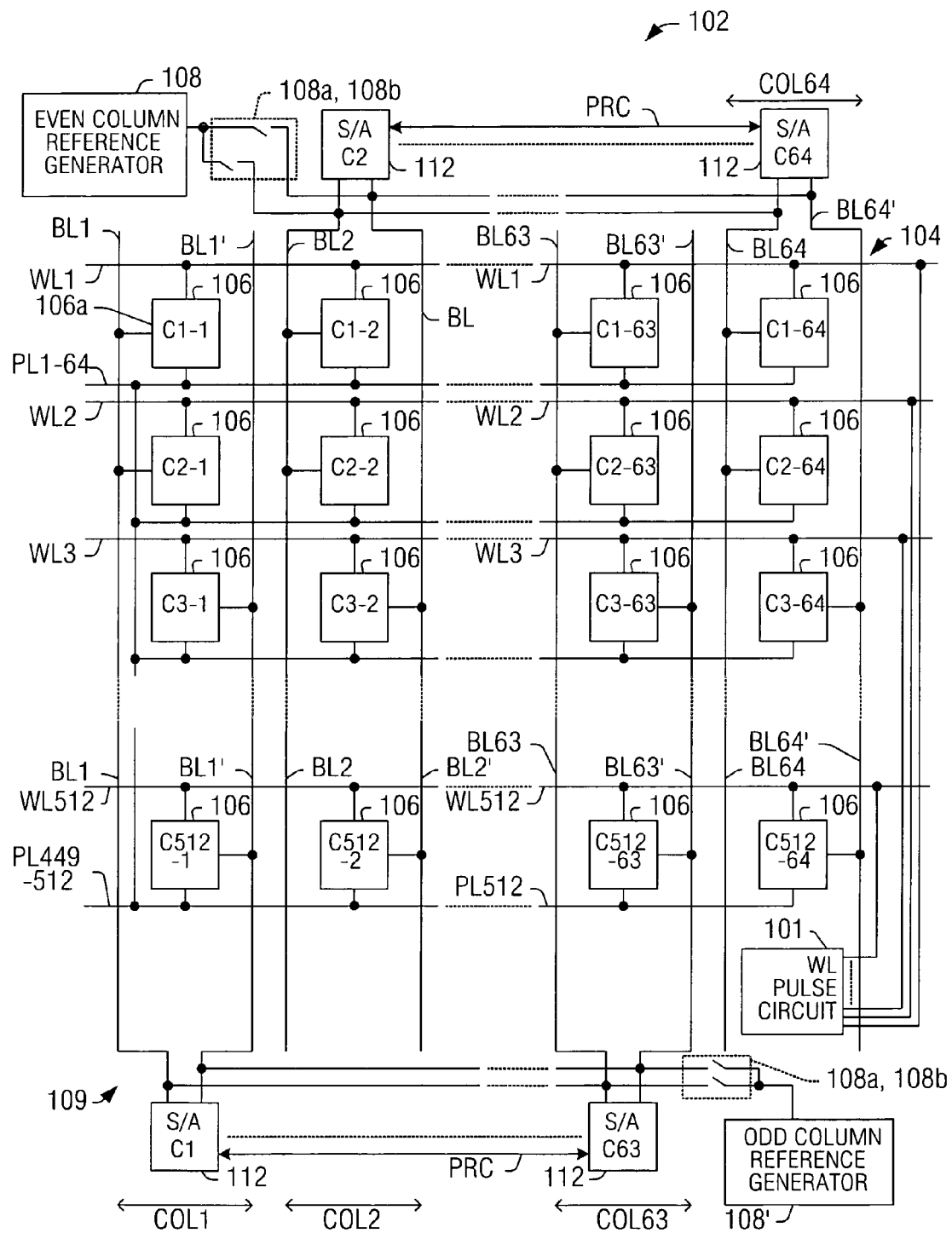
Figure 3F:
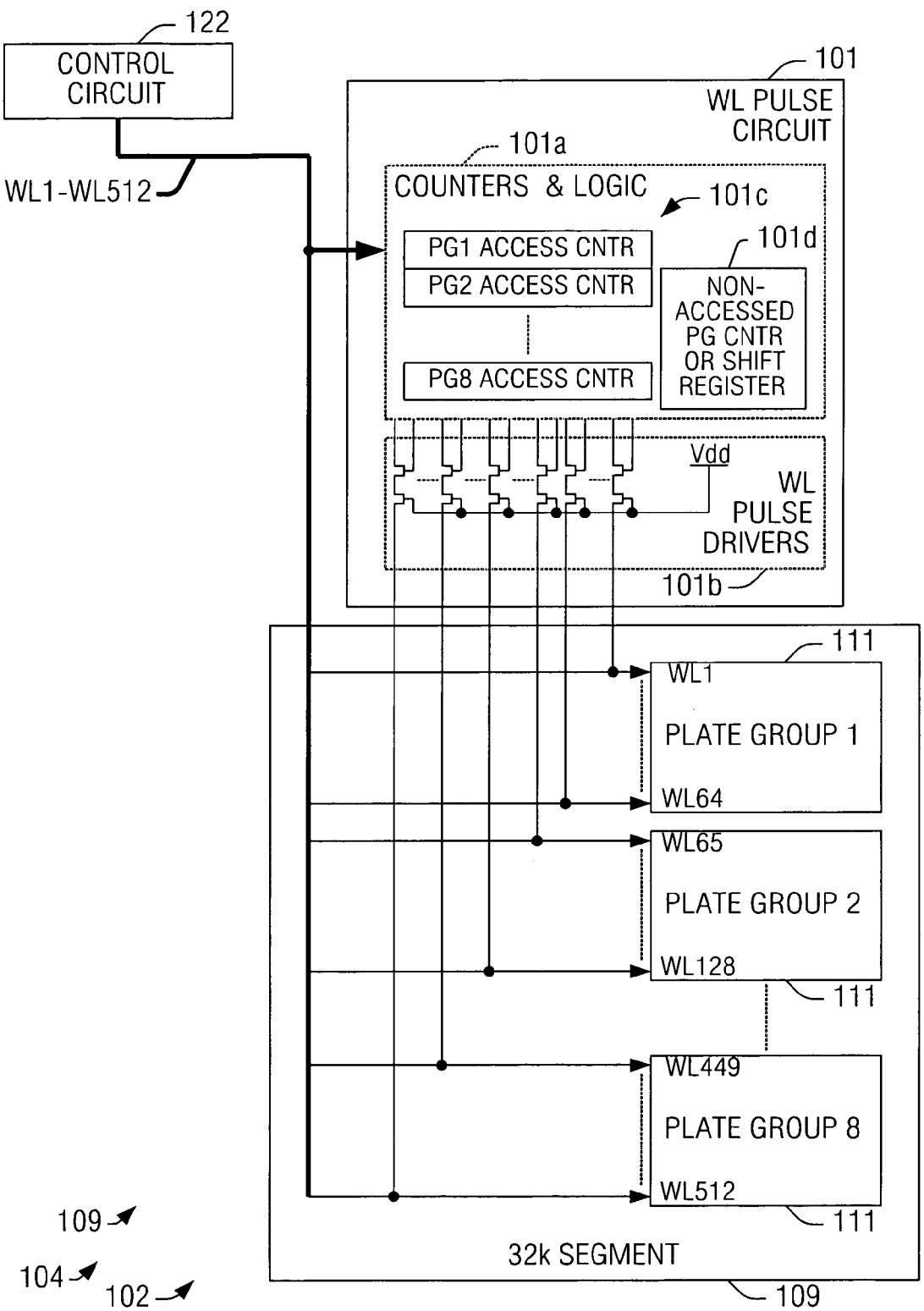
Figure 3G:
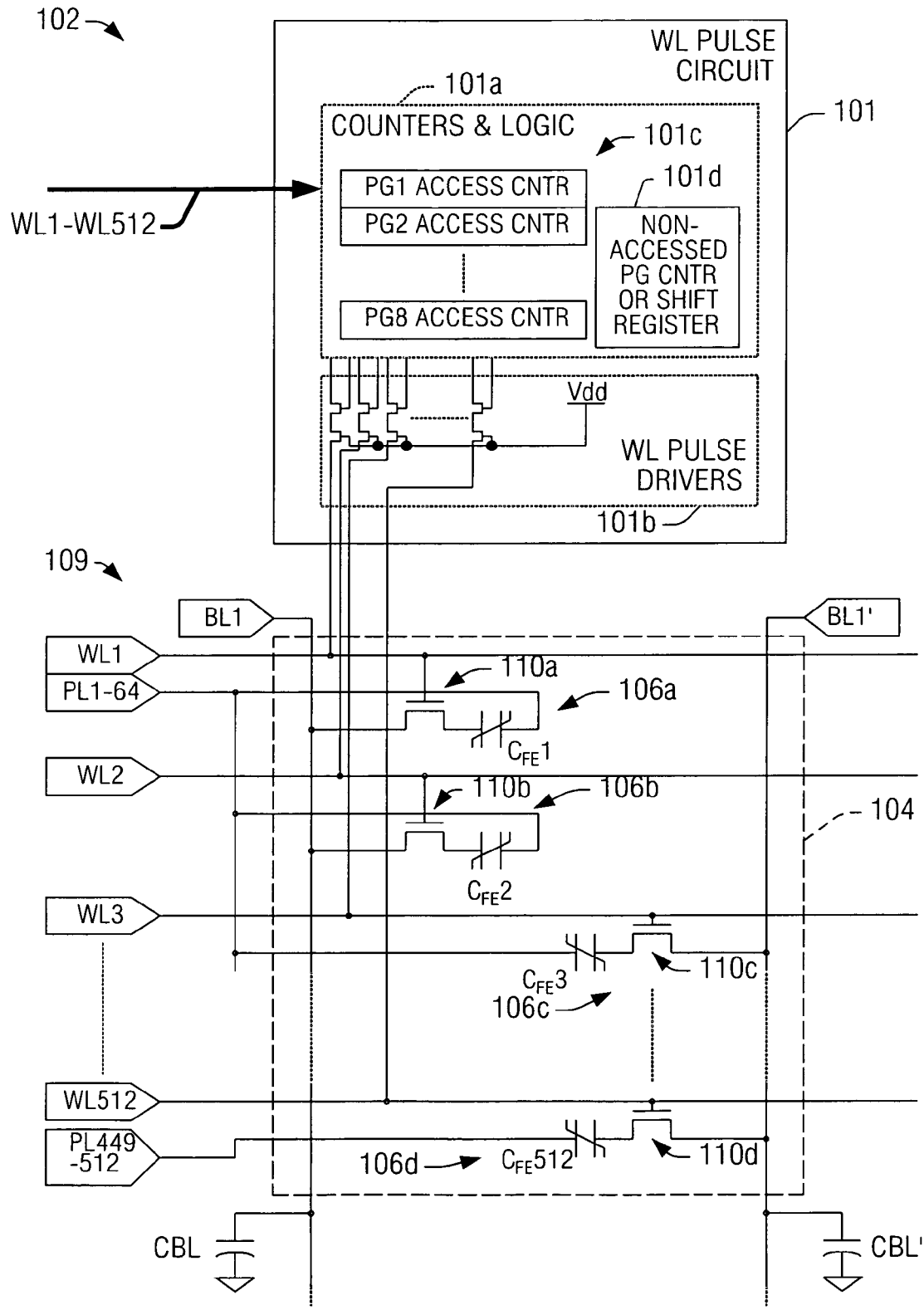
Figure 3H:
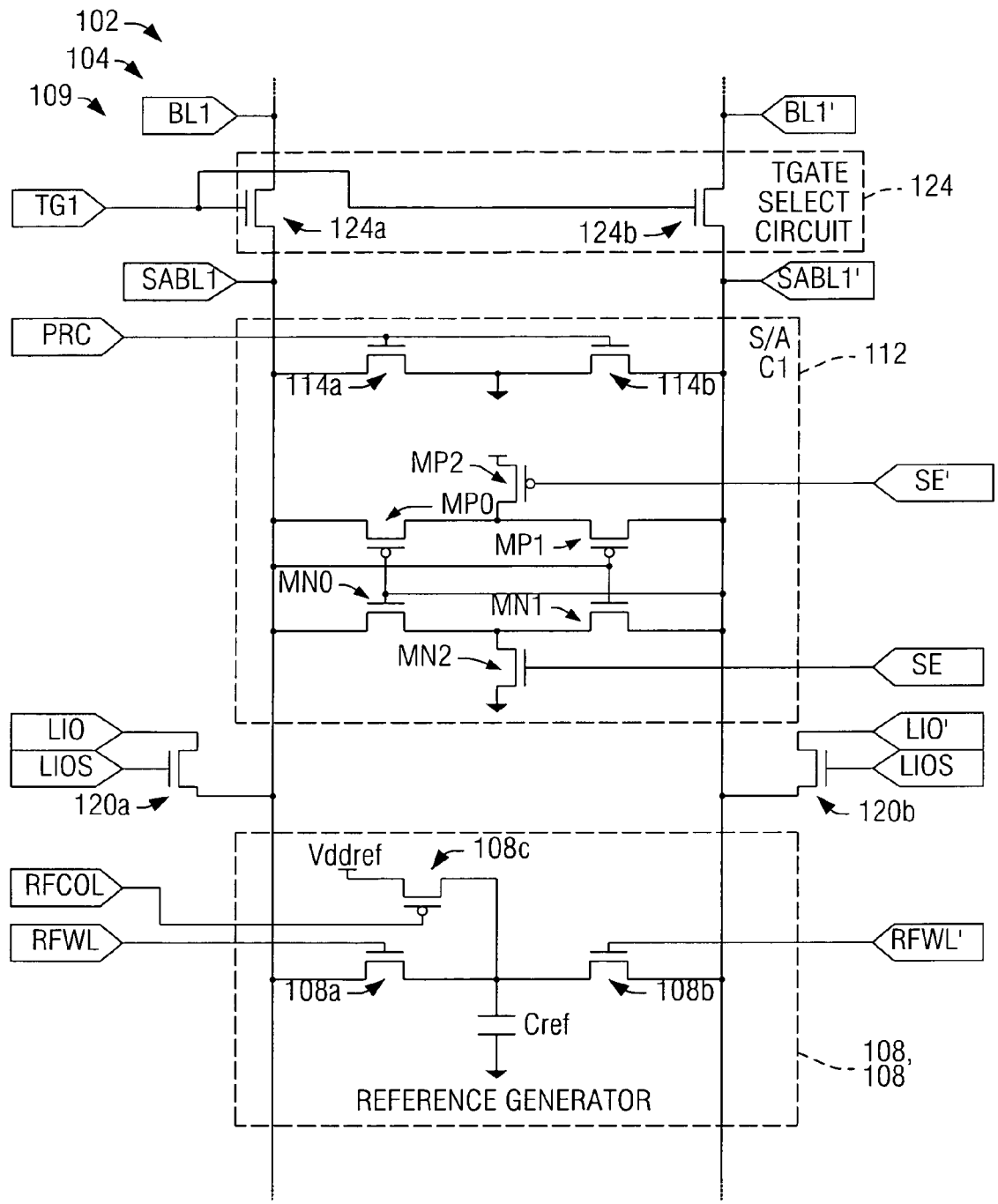
Figure 31:
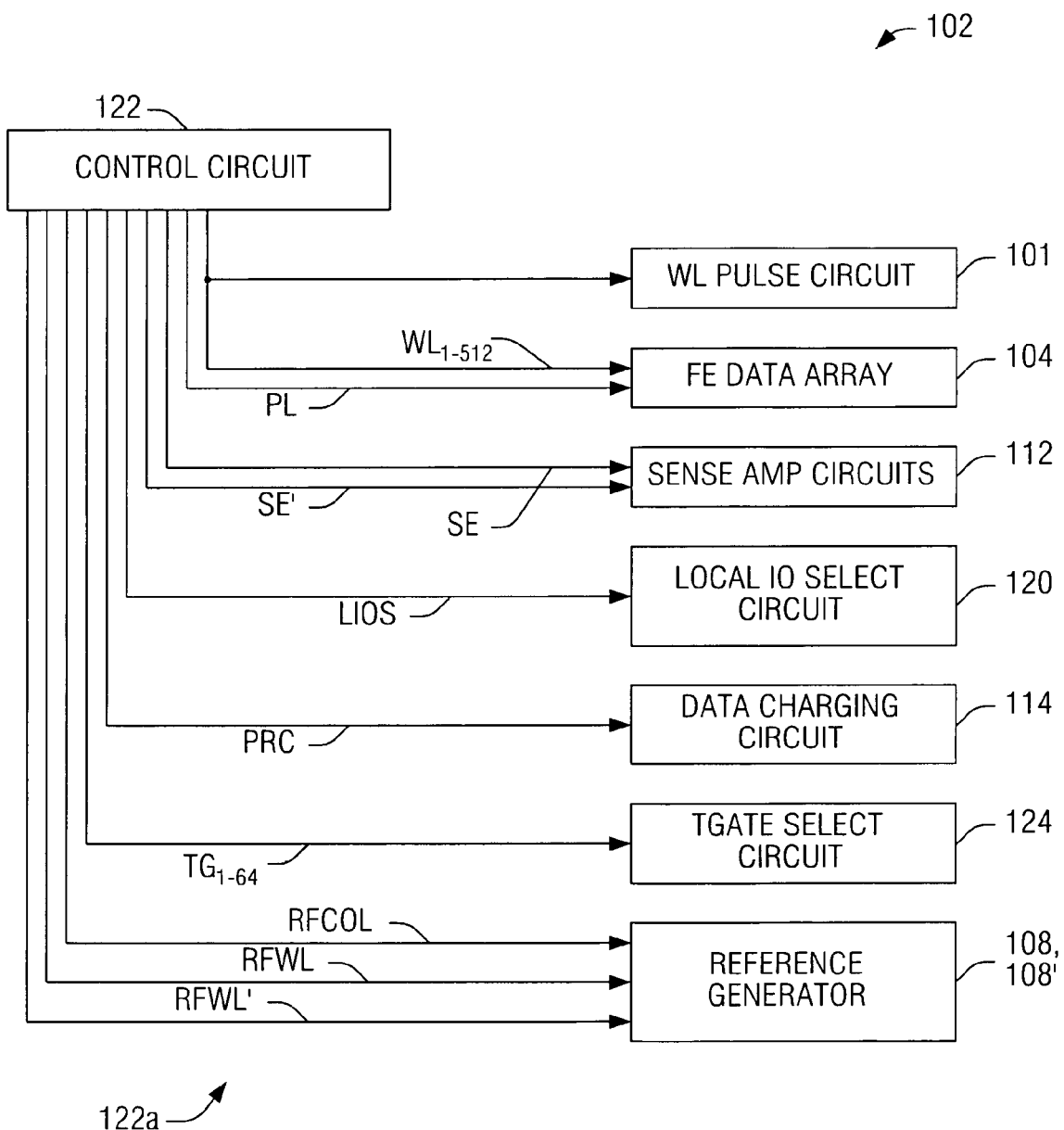
Figure 3J:
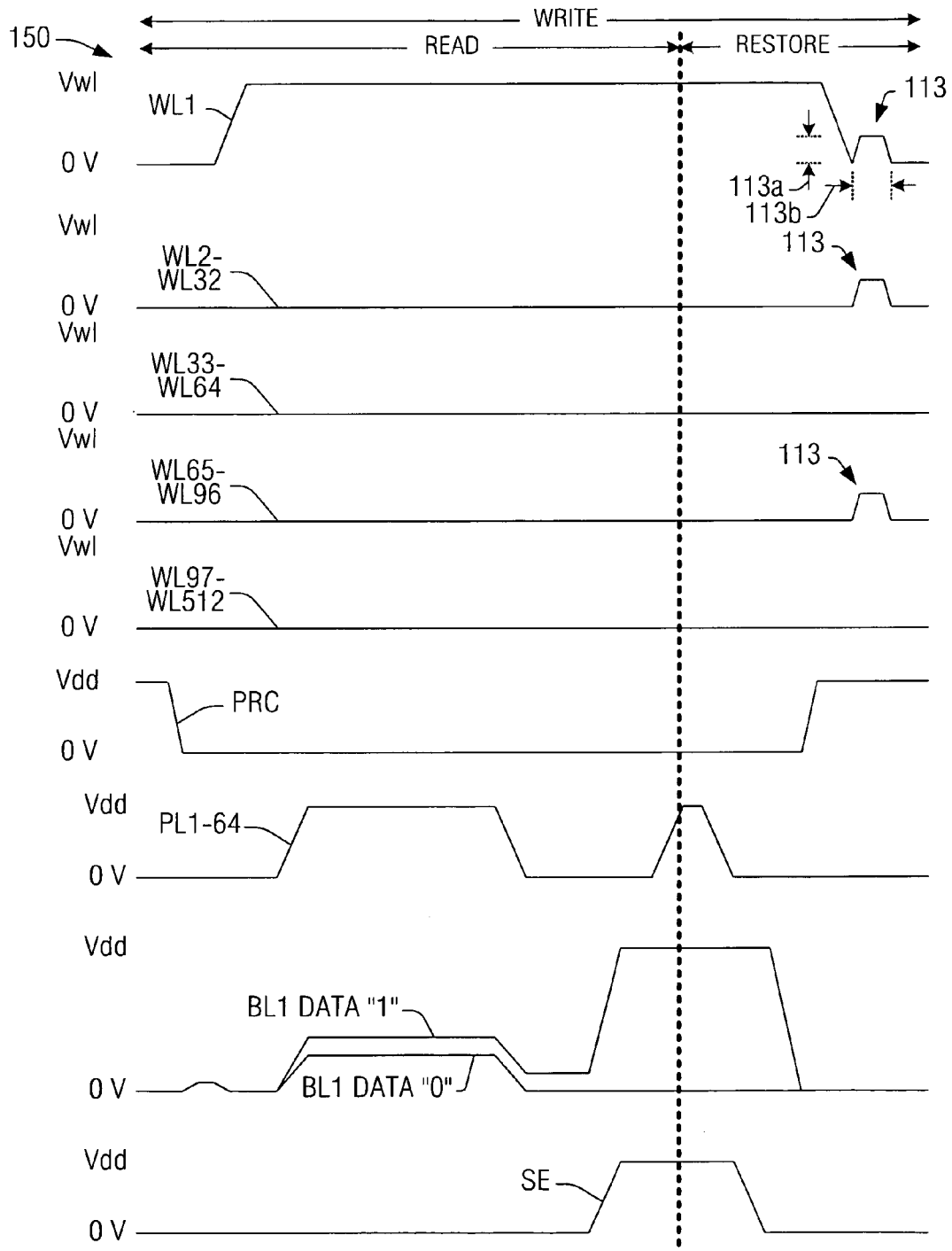
FIG. 3J is a timing diagram illustrating exemplary signals and waveforms during memory access operations in the device of FIGS. 3A–3I.

Referring also to FIGS. 3E–3I, FIG. 3E further illustrates the exemplary memory segment 109, FIG. 3F illustrates further details of the exemplary wordline pulse circuit 101 in the segment 109, and FIGS. 3G and 3H illustrate an exemplary column in the segment 109. FIG. 3I illustrates the exemplary control circuit 122 and various control signals 122a generated thereby, and FIG. 3J shows a timing diagram 150 illustrating operation of the exemplary ferroelectric memory device 102 during read, restore, and write operations in accordance with the invention. As seen in FIG. 3E, the device 102 comprises a folded bitline ferroelectric memory array 104, reference generators 108 and 108' coupled with the bitlines BL1/BL1' through BL64/BL64' of the array 104 via switches 108a and 108b, and sense amps 112. TGATE select circuits 124 are provided (FIG. 3H) for each column to selectively couple the sense amps 112 with bitlines of the illustrated segment 109, thus allowing sharing of the sense amps 112. A wordline pulse circuit 101 is provided in the device 102 to selectively activate wordlines for discharging cell storage nodes in accordance with the invention. The ferroelectric memory array segment 109 comprises 1T1C ferroelectric data memory cells 106 organized in rows along wordlines WL1–WL512 and columns along complementary data bitline pairs BL/BL' in a folded bitline configuration, wherein the wordlines WL1–WL512 and other control and timing signals 122a are provided by a control circuit 122 (FIG. 3I).

In the exemplary array segment 109, the memory cells along WL1 and WL2 (as well as those along WL5, WL6, WL9, WL10, ..., WL509, WL510) are coupled with bitlines BL1–BL64, whereas cells along WL3 and WL4 (as well as those along WL7, WL8, WL11, WL12, ..., WL511, WL512) are coupled with the complementary bitlines BL1'–BL64'. In reading the first data word along the wordline WL1, the cells C1-1 through C1-64 are connected to the sense amps via the bitlines BL1, BL2 ..., BL63, and BL64 while the complementary reference bitlines BL1', BL2' ..., BL63', and BL64' are connected to the reference voltage generators 108, 108'. The wordline numbering of the device 102 is exemplary only, wherein other wordline/row organizations are possible within the scope of the invention.

FIGS. 3G and 3H illustrate further details of the first column of the segment 109 along the data bitline pair BL1/BL1', which includes an exemplary wordline pulse circuit 101 coupled with the control circuit 122 and the wordlines of the array segment 109. Several exemplary ferroelectric memory data cells 106a–106d are illustrated in FIG. 3G comprising ferroelectric capacitors $C_{FE}1$–$C_{FE}512$ and n-channel MOS cell access transistors 110a–110d configured in the first column along the bitlines BL1 and BL1', wherein the exemplary segments 109 include 64 such columns. The ferroelectric cell capacitors $C_{FE}$ may be fabricated from any appropriate ferroelectric material in a wafer, such as Pb(Zr,Ti)O3 (PZT), (Ba,Sr)TiO3 (BST), SrTiO3 (STO), SrBi2Ta2O9 (SBT), BaTiO3 (BTO), (Bi1-xLax)4Ti3O12 (BLT), or other ferroelectric material fabricated between two conductive electrodes to form a ferroelectric capacitor $C_{FE}$.

The cells 106a–106d of FIG. 3E and the contents thereof are accessed during read, restore, and write operations via the array bitlines BL1 and BL1' through activation of the wordline and plateline signals WL1–WL512 and PL1–PL512, respectively, by the control circuit 122 of FIG. 3I. The ferroelectric capacitor $C_{FE}1$ of the first row is coupled with the bitline BL1 via the first wordline signal WL1 and an access transistor 110a, and the cell capacitor $C_{FE}1$ is accessed via activation of a cell plateline signal (e.g., pulse) PL1 from the control system 122. In the illustrated implementation, the array bitline is precharged to ground (e.g., Vss or 0V) via PRC signal using transistors 114a and 114b in the sense amp circuit 112, and the plate line is activating by bringing the plateline PL1 to Vdd or some other positive voltage, thereby creating a voltage across the cell capacitor $C_{FE}1$. In other implementations, the plateline signal can be activated by any signal on the plateline PL1 or combination of plateline and bitline control signals by which a voltage is created across the cell capacitor $C_{FE}1$ (e.g., the plateline voltage is different than the bitline voltage) to access (e.g., read) the data thereof. Thereafter, the plateline is deactivated before enabling the sense amp 112 by bringing the plateline voltage PL1 back to Vss. The plateline pulse PL1 thus causes charge to be transferred from the cell capacitor $C_{FE}1$ during a read operation, whereby a voltage is established on the bitline BL1 that is representative of the data stored in the cell 106a.

Also during the read operation, a reference voltage is supplied to the complementary bitline BL1' via reference generator 108' by charging a reference capacitor Cref to a voltage Vddref (FIG. 3H) according to a signal RFCOL from the control system 122. The charged reference capacitor Cref is then selectively coupled to one of the complementary bitlines BL1 or BL1' (e.g., to BL1' in the case where the first row is accessed) according to control signals RFWL and RFWL', respectively, from the control system 122. The sense amp 112 (FIG. 3H) then senses the differential voltage on the bitline pair BL1/BL1' to ascertain the data state stored in the target cell 106a. The data may then be transferred to I/O circuitry via local I/O data lines LIO/LIO' according to a signal LIOS to turn on I/O access transistors 120a and 120b in FIG. 3H. During read and other memory access operations, the sense amp 112 and the sense amp bitlines SABL/SABL' thereof are coupled with the array bitlines BL1/BL1' via transistors 124a and 124b in a TGATE select circuit 124 according to a signal TG1 from the control system 122 (FIG. 3H). The exemplary sense amp 112 of FIG. 3H comprises NMOS transistors MN0, MN1, and MN2 as well as PMOS transistors MP0, MP1, and MP2. The sense amp 112 is enabled using sense amp enable signals SE and SE' provided by the control circuit 122 to sense amp transistors MN2 and MP2, respectively.

FIG. 3J illustrates a timing or waveform diagram 150 showing exemplary read and restore operations targeting cells along the first row of the segment 109 (e.g., along WL1). A write operation in the exemplary device is similar to the illustrated restore operation. To sense the data of the cell 106 during the read operation, a reference voltage is applied to the complementary bitline BL1', for example, using reference generator 108' and switch 108a in FIG. 3H. This creates a differential voltage at the input terminals of the sense amp 112 (e.g., sense amp bitlines SABL1/SABL1'), the polarity of which indicates the data stored in the target data cell 106a. In the pulse sensing example of FIG. 3J, the cell plateline PL1 is then brought low (e.g., deactivated) and the sense amp is thereafter enabled via the SE signal to begin sensing operation. Alternatively, step sensing may be employed, wherein the sense amp enable signal SE is brought high prior to deactivating the plateline PL1 signal (e.g., prior to bringing PL1 low. Once the sense amp enable signal SE is raised, the sense amp 112 clamps the bitlines BL1/BL1' to Vdd and 0 V, depending on the cell data state, and thereafter the local I/O signal LIOS can be asserted to provide the sensed data to I/O circuitry (not shown). Following a read operation, the data is written back (e.g., restored) into the target cell 106, wherein another pulse is applied to the cell plateline PL1 while the sense amp 112 has latched the data (e.g., while one bitline is at Vss and the other is at Vdd, depending on the data). In a write operation the local I/O signal LIOS latches the data into the sense amp 112 and subsequently impresses the data over the bitlines BL1/BL1' or SABL1/SABL1', or alternatively, the local I/O signal LIOS directly impresses the data onto the bitlines BL1/BL1' or SABL1/SABL1' during the write or restore period. As illustrated in FIG. 3J, after the data has been restored to the cell 106a with PL1 (also at Vss are PL2–PL64 in the shared plateline driver configuration of the device 102) the control circuit 122 brings the wordline WL1 low, activates the PRC signal to precharge the bitlines to Vss. At this point, the wordline pulse circuit 101 activates the selected wordline WL1 and those non-selected wordlines of the other rows in the first subgroup (WL2–WL32) of the selected first plate group 111 by providing short wordline pulses or blips 113 to momentarily raise the wordlines WL1–WL32 above Vss. In the illustrated example, the wordline pulse circuit 101 also activates the wordlines WL65–WL96 in a first subgroup of a non-selected (e.g., non-accessed) plate group 111 by providing similar pulses 113 thereto.

As illustrated in FIGS. 3F and 3G, the wordline pulse circuit or system 101 is coupled with the control system 122 and with the array segment 109, wherein the control system 122 provides the wordlines WL1–WL512 and the pulse circuit 101 provides the selective wordline activation pulses 113 to the array 104. The wordline pulse system may be constructed using any suitable logic or other circuitry, including timers, gates, and power circuitry, so as to activate one or more non-selected wordlines in the array 104 before, during, or after a read, restore, or write operation while one or more bitlines and platelines associated with ferroelectric memory cells along the one or more non-selected wordlines are both substantially at a first voltage to discharge storage nodes of cells along the one or more non-selected wordlines.

Figure 1B:
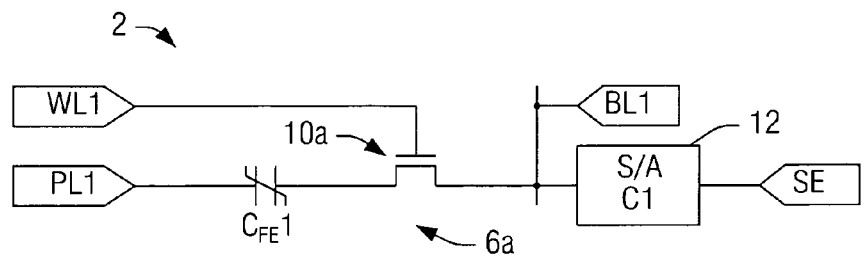
FIG. 1B is a schematic diagram illustrating a 1T1C cell and an associated sense amp in the device of FIG. 1A.
Figure 1C:
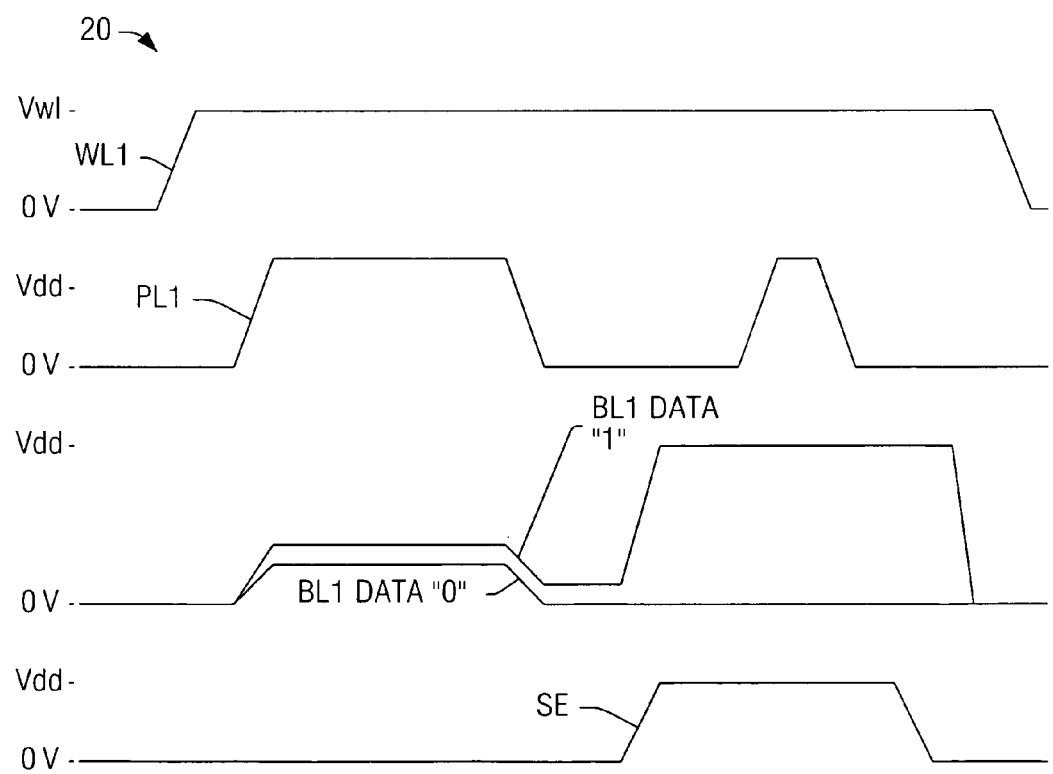
FIG. 1C is a waveform diagram illustrating a conventional read operation in the cell of FIGS. 1A and 1B.

The exemplary wordline pulse circuit 101 comprises counters and logic 101a as well as wordline pulse drivers 101b to generate the selective pulses 113, where the exemplary wordline pulse drivers 101b individually comprise two NMOS transistors coupled in series between the logic 101a and the corresponding array wordline, with one of the two transistor gates (lower gate in FIGS. 3F–G tied to Vdd. In the device 102, the logic 101a provides signals to the drivers 101b at either Vdd or Vss to selectively activate the corresponding wordlines. The cascode configuration of each transistor pair driver provides for selective pulsing to raise the wordline voltage from ground or Vss to the level 113a (e.g., pulses 113 of FIG. 3J), wherein the selected upper gate of the driver is brought from Vss to Vdd during a memory access (e.g., except for the selected wordline for the accessed cells, for which the upper gate of the driver may optionally be held at Vss during the memory access) and the source thereof is brought from Vss to Vdd for the pulse duration 113b at a time when the bitline and plateline associated with the corresponding cell are at Vss. The exemplary cascode dual nmos arrangement of the exemplary wordline pulse circuit 101 operates in conjunction with a pmos wordline driver of the control circuit 122, which provides the normal wordline signals according to decoded address information. Any suitable driver circuitry can be employed in creating the wordline activation pulses 113 within the scope of the present invention. Although the exemplary cascode configuration is not always necessary, it is used to address reliability issues, since the wordline voltage exceeds the nominal supply voltage Vdd. The wordline voltage typically exceeds Vdd plus a threshold voltage of the access transistor 10a in FIG. 1B. In one possible alternative implementation, the wordline pulse drivers may individually comprise a single NMOS transistor coupled in series between the logic circuit and the corresponding wordline for selectively activating the corresponding wordline.

The logic 101a includes a plurality of plate group access counters 101c that are individually associated with plate groups 111 of the segment 109 to indicate a number of accesses of cells in the associated plate group 111. In one implementation, the pulse system 101 selectively activates a first subset of other wordlines in a first plate group that may or may not include the selected wordline before, during, or after the read, restore, or write operation while the bitlines and platelines associated with the first plate group are substantially at the first voltage according to a plate group access counter associated with the first plate group. The wordline pulse system 101 may also comprise a non-accessed plate group counter or shift register 101d indicating a particular plate group 111 of the segment 109, which determines which non-selected plate group 111 or 32 row subgroup thereof will receive a wordline activation pulse 113.

The wordline activation pulses 113 (FIG. 3J) can be of any amplitude 113a, for example, at or about the threshold voltage of the cell transistors 110, or even less, and the pulses 113 may be of any duration 113b, for example, about 1 ns in the exemplary implementation. The wordline activation pulses 113, moreover, may be provided at any time in a memory access cycle, such as before, during, or after a memory access operation (e.g., including read, restore, write, or other operations in which memory cells are accessed). In the illustrated implementation of FIG. 3J, the selective wordline pulses 113 are applied after the restore operation that follows a memory read, as well as after a write operation. Alternatively, the wordline activation pulses 113 may be selectively applied by the circuit 101 prior to such memory access operations while the bitlines are precharged to Vss or other first voltage level (e.g., while PRC is high) and while the corresponding plateline signals are held substantially at the first voltage.

As discussed above, the selective wordline activation pulses 113 may, but need not, be provided every time the segment 109 is accessed. Furthermore, activation pulses 113 may be provided to all of the wordlines, or only certain wordlines or groups thereof may be selectively activated, as in the illustrated device 102. In the illustrated implementations, the selected wordline WL1 and the non-selected wordlines WL2–WL32 in the first subgroup of the selected plate group 111 are pulsed for the illustrated read/restore or write operation, wherein the current count value of the non-accessed plate group counter or shift register 101d may be used to determine which subgroup is pulsed for the selected plate group 111 and/or which subgroup of the non-selected current plate group 111 is pulsed. Alternatively, the selected plate group subgroup is alternated for each successive access thereto. The selectivity in the wordline activation may be employed, for example, to facilitate conservation of power in the device 102.

Other plate group and/or subgroup selection algorithms or criteria may be used in selecting which wordlines will be activated within the scope of the invention. For example, the wordline pulse circuit 101 may include programmable devices, such as electronic fuse ("efuse") devices for each 512 k section 107, or for each segment 109, with a loadable shift register (not shown) to generate periodic or algorithmic 32 WL subgroup selection for activation pulses 113. In one possible implementation, the plate group or subgroup wordline activation can be performed every 32, 16, 8, or 4 section or segment accesses, wherein the programmable efuse seed values can be loaded into the device 102 from an external source on powerup. For example, a 8 bit non-accessed plate group shift register 101d may be employed (former case), wherein each bit of the shift register is associated with a particular plate group or a 16 bit register 101d can be used with each bit being associated with a plate subgroup (later case). The contents of the shift register 101d are shifted one position for every memory access operation, wherein the plate group associated with a particular bit of the register is selectively activated during a memory access operation if the corresponding bit is a "1". In the former case, a single "1" and seven "0"s (in the later case a single "1" and fifteen "0"s) can be loaded into the shift register 101d on power-up, whereby wordlines of each plate group (e.g., or a subgroup thereof) will be selectively activated once every 8 cycles for the former case and each subgroup is activated at least every 16 cycles in the later case. Loading different seed values into the register 101d can provide different activation frequencies, for example, wherein loading four sets of "10"s in the former case causes a given plate group to be activated every 2 cycles. In the later case loading four sets of "1000"s causes each subgroup to be activated at least every 4 cycles.

For activation of the selected plate group wordlines, the pulses 113 are preferably provided more frequently due to potentially strong plateline pumping at the cell storage nodes of the non-selected wordlines. In the exemplary device with two 32 wordline subgroups in the selected plate group 111 (e.g., subgroups "A" and "B", as shown in FIG. D), the plate group access counters 101c can be simple 1-bit flip-flops, wherein the subset to be activated is alternated every other time memory cells in the first plate group are accessed according to the counter value. In another possible implementation, the plate group access counters 101c can be 3-bit counters used to generate the wordline pulses 113 (e.g., to provide either Vdd or Vss to certain ones of the drivers 101b) according to the selected plate group subgroup selection algorithm of table 1.

TABLE 1

| efuse bit values | CNT = 1 | CNT = 2 | CNT = 3 | CNT = 4 | CNT = 5 | CNT = 6 | CNT = 7 | CNT = 8 |
|---|---|---|---|---|---|---|---|---|
| 11 | A & B | A & B | A & B | A & B | A & B | A & B | A & B | A & B |
| 10 | A | B | A | B | A | B | A | B |
| 01 | A | none | B | none | A | none | B | None |
| 00 | A | none | none | none | B | none | None | None |

The exemplary device 102 also provides for selectively activating wordlines of one or more non-accessed plate groups 111, which may be employed alone or in combination with the selected group activation. In FIG. 3F, the wordlines of a second plate group (e.g., the plate group 111 including WL65–WL128 in the illustrated example of FIG. 3J) are also selectively activated (alternating subgroups A and B thereof). The non-accessed plate group counter or shift register 101d in the exemplary circuit 101 is incremented every time a segment in the section 107 is accessed, wherein the counter value or register bit pattern indicates which plate group or groups 111 is to be activated in that cycle, wherein the above algorithm may be used to determine which subgroup thereof is activated according to the corresponding counter 101c.

Although the invention has been described for 1T/1C type of cells, it is also applicable to 2T/2C type of cells. In 2T/2C cells, a pair of wordlines is activated simultaneously and the pair is considered as one wordline. Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for accessing ferroelectric memory cells in a ferroelectric memory device, the method comprising:
   performing a read, restore, or write operation to access one or more ferroelectric memory cells along a selected wordline in a ferroelectric memory array; and
   activating a non-selected wordline while a bitline and a plateline associated with the ferroelectric memory cells along the non-selected wordline are both substantially at a first voltage, and
   further comprising at least one of the following:
   wherein the first voltage is ground; or
   activating one or more wordlines on power-up while corresponding bitlines and platelines are substantially at the first voltage; or
   activating one or more wordlines before power-down while corresponding bitlines and platelines are substantially at the first voltage.

2. A method for accessing ferroelectric memory cells in a ferroelectric memory device, the method comprising:
   performing a read, restore, or write operation to access one or more ferroelectric memory cells along a selected word line in a ferroelectric memory array; and
   activating a non-selected wordline while a bitline and a plateline associated with the ferroelectric memory cells along the non-selected wordline are both substantially at a first voltage; and
   activating other wordlines in a first plate group that includes cells along the selected wordline while bitlines and platelines associated with the first plate group are substantially at the first voltage to discharge storage nodes of cells of the first plate group.

3. The method of claim 2, wherein the wordlines in the first plate group are activated while the bitlines and platelines associated with the first plate group are substantially at the first voltage each time memory cells in the first plate group are accessed.

4. The method of claim 2, wherein the wordlines in the first plate group are activated while the bitlines and platelines associated with the first plate group are substantially at the first voltage every Nth time memory cells in the first plate group are accessed, N being an integer greater than 1.

5. The method of claim 2, wherein a first subset of wordlines in the first plate group are selectively activated while the bitlines and platelines associated with the first plate group are substantially at the first voltage each time memory cells in the first plate group are accessed, wherein the first subset of wordlines in the first plate group is chosen for selective activation according to a plate group access counter associated with the first plate group.

6. The method of claim 5, wherein the first subset is half of the wordlines in the first plate group and a second subset is the remaining half of the wordlines in the first plate group, wherein one of the first and second subsets of the wordlines in the first plate group are selectively activated while the bitlines and platelines associated with the first plate group are substantially at the first voltage every time memory cells in the first plate group are accessed, wherein the subset to be activated is alternated every other time memory cells in the first plate group are accessed.

7. The method of claim 2, further comprising activating wordlines in a second plate group that does not include the selected wordline while bitlines and platelines associated with the second plate group are substantially at the first voltage.

8. The method of claim 7, wherein the second plate group is one of a plurality of non-selected plate groups that do not include the selected wordline, and wherein the second plate group is chosen for selective activation according to a non-accessed plate group counter or shift register.

9. The method of claim 7, wherein the first voltage is ground.

10. The method of claim 2, wherein the first voltage is ground.

11. A method for accessing ferroelectric memory cells in a ferroelectric memory device, the method comprising:
performing a read, restore, or write operation to access one or more ferroelectric memory cells along a selected wordline in a ferroelectric memory array; and
activating a non-selected wordline while a bitline and a plateline associated with the ferroelectric memory cells along the non-selected wordline are both substantially at a first voltage; and
activating wordlines in a plate group that does not include the selected wordline while bitlines and platelines associated with the plate group are substantially at the first voltage.

12. The method of claim 11, wherein the plate group is one of a plurality of non-selected plate groups that do not include the selected wordline, and wherein the plate group is chosen for selective activation according to a non-accessed plate group counter or shift register.

13. The method of claim 11, wherein the first voltage is ground.

14. A ferroelectric memory device, comprising:
an array of ferroelectric memory cells arranged in rows and columns, the cells individually comprising at least one ferroelectric cell capacitor having a first terminal and a second terminal coupled with a plateline, and at least one cell transistor adapted to selectively couple the first cell capacitor terminal to an array bitline associated with an array column according to an array wordline, wherein rows of the memory cells are coupled with a corresponding wordline and a plateline, wherein the array comprises a plurality of plate groups, and wherein cells along a plurality of wordlines in a plate group are coupled with a common plateline;
a control system coupled with the array, the control system providing wordline and plateline signals to the array during read, restore, and write operations to access one or more ferroelectric memory cells along a selected wordline in the array; and
a wordline pulse system coupled with the control system and with the array, the wordline pulse system being adapted to activate one or more non-selected wordlines in the array while one or more bitlines and platelines associated with ferroelectric memory cells along the one or more non-selected wordlines are both substantially at a first voltage; and further comprising at least one of the following:
wherein the first voltage is ground; or
wherein the wordline pulse system comprises a plurality of plate group access counters, the plate group access counters being individually associated with plate groups of the array and indicating a number of accesses of cells in the associated plate group, wherein the wordline pulse system selectively activates a first subset of wordlines in a first plate group that includes cells along the selected wordline while the bitlines and platelines associated with the first plate group are substantially at the first voltage each time memory cells in the first plate group are accessed, and wherein the first subset of the wordlines in the first plate group is chosen for selective activation according to a plate group access counter associated with the first plate group; or
wherein the wordline pulse system comprises a logic circuit and a plurality of wordline pulse drivers individually associated with wordlines in the array, the wordline pulse drivers individually comprising two NMOS transistors coupled in series between the logic circuit and the corresponding wordline for selectively activating the corresponding wordline; or
wherein the wordline pulse system comprises a logic circuit and a plurality of wordline pulse drivers individually associated with wordlines in the array, the wordline pulse drivers individually comprising an NMOS transistor coupled in series between the logic circuit and the corresponding wordline for selectively activating the corresponding wordline.

15. The device of claim 14, wherein the wordline pulse system is adapted to activate non-selected wordlines in a first plate group that includes cells along the selected word line before, during, or after the read, restore, or write operation while bitlines and platelines associated with the ferroelectric memory cells along wordlines in the first plate group are substantially at a first voltage.

16. The device of claim 14, wherein the wordline pulse system is adapted to activate wordlines in a second plate group that does not include cells along the selected wordline before, during, or after the read, restore, or write operation while bitlines and platelines associated with the ferroelectric memory cells along wordlines in the second plate group are substantially at the first voltage.

17. The device of claim 14, wherein the wordline pulse system is further adapted to activate the selected wordline while a bitline and a plateline associated with memory cells along the selected wordline are substantially at the first voltage.

18. A ferroelectric memory device, comprising:
an array of ferroelectric memory cells arranged in rows and columns, the cells individually comprising at least one ferroelectric cell capacitor having a first terminal and a second terminal coupled with a plateline, and at least one cell transistor adapted to selectively couple the first cell capacitor terminal to an array bitline associated with an array column according to an array wordline, wherein rows of the memory cells are coupled with a corresponding wordline and a plateline, wherein the array comprises a plurality of plate groups, and wherein cells along a plurality of wordlines in a plate group are coupled with a common plateline;
a control system coupled with the array, the control system providing wordline and plateline signals to the array during read, restore, and write operations to access one or more ferroelectric memory cells along a selected wordline in the array; and a wordline pulse system coupled with the control system and with the array, the wordline pulse system being adapted to activate one or more non-selected wordlines in the array while one or more bitlines and platelines associated with ferroelectric memory cells along the one or more non-selected wordlines are both substantially at a first voltage, and wherein the wordline pulse system is further adapted to activate wordlines in a first plate group that includes cells along the selected wordline while bitlines and platelines associated with the ferroelectric memory cells along wordlines in the first plate group are substantially at the first voltage.

19. The device of claim 18, wherein the wordline pulse system activates wordlines in the first plate group while the bitlines and platelines associated with the first plate group are substantially at the first voltage each time memory cells in the first plate group are accessed.

20. The device of claim 18, wherein the wordline pulse system activates wordlines in the first plate group while the bitlines and platelines associated with the first plate group are substantially at the first voltage every Nth time memory cells in the first plate group are accessed, N being an integer greater than 1.

21. The device of claim 18, wherein the wordline pulse system comprises a plurality of plate group access counters, the plate group access counters being individually associated with plate groups of the array and indicating a number of accesses of cells in the associated plate group, wherein the wordline pulse system selectively activates a first subset of wordlines in the first plate group while the bitlines and platelines associated with the first plate group are substantially at the first voltage each time memory cells in the first plate group are accessed, and wherein the first subset of the wordlines in the first plate group is chosen for selective activation according to a plate group access counter associated with the first plate group.

22. The device of claim 21, wherein the first subset is half of the wordlines in the first plate group and a second subset is the remaining half of the wordlines in the first plate group, wherein the wordline pulse system selectively activates one of the first and second subsets of the wordlines in the first plate group while the bitlines and platelines associated with the first plate group are substantially at the first voltage every time memory cells in the first plate group are accessed, and wherein the subset to be activated is alternated every other time memory cells in the first plate group are accessed.

23. The device of claim 18, wherein the wordline pulse system is further adapted to activate wordlines in a second plate group that does not include cells along the selected wordline while bitlines and platelines associated with the ferroelectric memory cells along wordlines in the second plate group are substantially at the first voltage.

24. The device of claim 23, wherein the wordline pulse system comprises a non-accessed plate group counter or shift register indicating a particular plate group of the array, wherein the second plate group is one of a plurality of non-selected plate groups that do not include the selected wordline, and wherein the second plate group is chosen for selective activation according to the non-accessed plate group counter or shift register.

25. A ferroelectric memory device, comprising:

an array of ferroelectric memory cells arranged in rows and columns;

a control system coupled with the array, the control system providing wordline and plateline signals to the array during read, restore, and write operations to access one or more ferroelectric memory cells along a selected wordline in the array; and a wordline pulse system to provide a pulse to one or more non-selected wordlines in the array while one or more bitlines and platelines associated with ferroelectric memory cells along the one or more non-selected wordlines are both substantially at a first voltage; and further comprising at least one of the following:

wherein the first voltage is ground; or wherein the wordline pulse system comprises a logic circuit and a plurality of wordline pulse drivers individually associated with wordlines in the array, the wordline pulse drivers individually comprising an NMOS transistor coupled in series between the logic circuit and the corresponding wordline for selectively activating the corresponding wordline.

* * * * *